United States Patent
Shi et al.

(10) Patent No.: US 7,633,129 B1
(45) Date of Patent: Dec. 15, 2009

(54) MEMORY DEVICES WITH ACTIVE AND PASSIVE LAYERS HAVING MULTIPLE SELF-ASSEMBLED SUBLAYERS

(75) Inventors: Xiaobo Shi, Woburn, MA (US); Richard Kingsborough, Acton, MA (US)

(73) Assignee: Spansion LLC, Sunnyvale, CA (US)

( * ) Notice: Subject to any disclaimer, the term of this patent is extended or adjusted under 35 U.S.C. 154(b) by 314 days.

(21) Appl. No.: 11/228,975

(22) Filed: Sep. 16, 2005

(51) Int. Cl.
*H01L 29/94* (2006.01)

(52) U.S. Cl. ............ 257/400; 257/40; 257/E51.002; 257/E51.003; 257/E51.023

(58) Field of Classification Search .......... 257/E51.002, 257/E51.003, E51.023, 40, 400
See application file for complete search history.

(56) References Cited

U.S. PATENT DOCUMENTS

| | | | | |
|---|---|---|---|---|
| 4,652,894 A | * | 3/1987 | Potember et al. ............ 257/1 |
| 4,780,790 A | * | 10/1988 | Takimoto et al. ............ 361/323 |
| 4,987,023 A | * | 1/1991 | Sato et al. ............ 428/215 |
| 5,185,208 A | * | 2/1993 | Yamashita et al. ........ 428/411.1 |
| 5,208,111 A | * | 5/1993 | Decher et al. ............ 428/420 |
| 5,518,767 A | * | 5/1996 | Rubner et al. ............ 427/259 |
| 5,536,573 A | * | 7/1996 | Rubner et al. ............ 428/378 |
| 6,324,091 B1 | * | 11/2001 | Gryko et al. ............ 365/151 |
| 6,447,887 B1 | * | 9/2002 | Claus et al. ............ 428/209 |
| 6,770,905 B1 | * | 8/2004 | Buynoski et al. ............ 257/40 |
| 6,773,954 B1 | * | 8/2004 | Subramanian et al. ........ 438/99 |
| 6,881,444 B2 | * | 4/2005 | Hong et al. ............ 427/240 |
| 6,955,939 B1 | * | 10/2005 | Lyons et al. ............ 438/82 |
| 2002/0149809 A1 | * | 10/2002 | Jackson ............ 359/107 |
| 2003/0124368 A1 | * | 7/2003 | Lynn et al. ............ 428/483 |
| 2003/0173612 A1 | * | 9/2003 | Krieger et al. ............ 257/304 |
| 2004/0159835 A1 | * | 8/2004 | Krieger et al. ............ 257/40 |
| 2004/0183069 A1 | * | 9/2004 | Afzali-Ardakani et al. .... 257/40 |
| 2006/0002168 A1 | * | 1/2006 | Krieger et al. ............ 365/115 |

OTHER PUBLICATIONS

Chen et al., Electronic Memory Effects in Self-Assembled Monolayer Systems, Physica E, vol. 16, 2003, pp. 17-23.*
T. Cassagneau et al., Layer-byLayer Assembly of Thin Film Zener Diodes from Conducting Polymers and CdSe Nanoparticles, J. Am. Chem. Soc., vol. 120, pp. 7848-7859, 1998.*

* cited by examiner

*Primary Examiner*—Kiesha L. Rose
*Assistant Examiner*—Peniel M Gumedzoe

(57) ABSTRACT

The present memory device includes first and second electrodes, an active layer and a passive layer, the active and passive layers being between the first and second electrodes, with either or both of the active layer and passive layer being made up a plurality of self-assembled sublayers.

10 Claims, 2 Drawing Sheets

MEMORY DEVICES WITH ACTIVE AND PASSIVE LAYERS HAVING MULTIPLE SELF-ASSEMBLED SUBLAYERS

BACKGROUND OF THE INVENTION

1. Technical Field

This invention relates generally to memory devices, and more particularly, to a memory device with improved data retention.

2. Background Art

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development have vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a relatively lower cost, but are slower than other types of storage devices. Storage devices also include memory devices, which are often, but not always, short term storage mediums. Memory devices tend to be substantially faster than long term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Memory devices generally include arrays of memory devices. Each memory device can be accessed or "read", "written", and "erased" with information. The memory devices maintain information in an "off" or an "on" state, also referred to as "0" and "1". Typically, a memory device is addressed to retrieve a specified number of byte(s) (e.g., 8 memory devices per byte). For volatile memory devices, the memory devices must be periodically "refreshed" in order to maintain their state. Such memory devices are usually fabricated from semiconductor devices that perform these various functions and are capable of switching and maintaining the two states. The devices are often fabricated with inorganic solid-state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, and the like).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity. Typically, fabrication processes for such cells are also not reliable.

Therefore, there is a need to overcome the aforementioned deficiencies.

FIG. 1 illustrates a type of memory device 30, which includes advantageous characteristics for meeting these needs. The memory device 30 includes an electrode 32 (for example copper), a copper sulfide layer 34 on the electrode 32, an active layer 36, for example a copper oxide layer, on the layer 34, and an electrode 38 (for example titanium) on the active layer 36. Initially, assuming that the memory device 30 is unprogrammed, in order to program the memory device 30, ground is applied to the electrode 38, while a positive voltage is applied to electrode 32, so that an electrical potential $V_{pg}$ (the "programming" electrical potential) is applied across the memory device 30 from a higher to a lower electrical potential in the forward direction of the memory device 30 (see FIG. 2, a plot of memory device current vs. electrical potential applied across the memory device 30). This potential is sufficient to cause copper ions to be attracted from the layer 34 toward the electrode 38 and into the active layer 36 (A) so that conductive filaments are formed, causing the active layer 36 (and the overall memory device 30) to be in a (forward) low-resistance or conductive state. Upon removal of such potential (B), the ions drawn into the active layer 36 during the programming step remain therein, so that the active layer 36 (and memory device 30) remain in a conductive or low-resistance state.

In the read step of the memory device 30 in its programmed (conductive) state, an electrical potential $V_r$ (the "read" electrical potential) is applied across the memory device 30 from a higher to a lower electrical potential in the forward direction of the memory device 30. This electrical potential is less than the electrical potential $V_{pg}$ applied across the memory device 30 for programming (see above). In this situation, the memory device 30 will readily conduct current, which indicates that the memory device 30 is in its programmed state.

In order to erase the memory device, a positive voltage is applied to the electrode 38, while the electrode 32 is held at ground, so that an electrical potential $V_{er}$ (the "erase" electrical potential) is applied across the memory device 30 from a higher to a lower electrical potential in the reverse direction of the memory device 30. This potential is sufficient to cause copper ions to be repelled from the active layer 36 toward the electrode 32 and into the layer 34 (C), causing the active layer 36 (and the overall memory device 30) to be in a high-resistance or substantially non-conductive state. This state remains upon removal of such potential from the memory device 30.

In the read step of the memory device 30 in its erased (substantially non-conductive) state, the electrical potential $V_r$ is again applied across the memory device 30 from a higher to a lower electrical potential in the forward direction of the memory device 30, as described above. With the active layer 34 (and memory device 30) in a high-resistance or substantially non-conductive state, the memory device 30 will not conduct significant current, which indicates that the memory device 30 is in its erased state.

It is highly desirable that the memory device, when programmed, be capable of retaining its programmed state for a long period of time, i.e., until it is desired that the state be changed to its erased state. Likewise, it is highly desirable that the memory device, when erased, be capable of retaining that state for a long period of time as chosen. While the above described device is effective in operation, it has been found that over a period of time, the conductive filaments formed in the programmed device can break down, causing the conductivity of the memory device to be significantly reduced, so that the memory device undesirably loses its programmed state. It will be understood that it is desirable for the device to be capable of stably retaining its programmed and erased states as desired. In addition, it will be understood that it is highly desirable that the memory device have a rapid switching speed when switching from the programmed to the erased state and vive versa.

DISCLOSURE OF THE INVENTION

The present memory device comprises first and second electrodes, an active layer and a passive layer, the active and passive layers being between the first and second electrodes, with at least one of the active layer and passive layer comprising a plurality of self-assembled sublayers.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

BEST MODE(S) FOR CARRYING OUT THE INVENTION

Reference is now made in detail to specific embodiments of the present invention which illustrate the best mode presently contemplated by the inventors for practicing the invention.

Reference is also made to U.S. Pat. No. 5,536,573 dated Jul. 16, 1996, entitled MOLECULAR SELF-ASSEMBLY OF ELECTRICALLY CONDUCTIVE POLYMERS, Rubner et al., and incorporated herein by reference.

Figure 1:
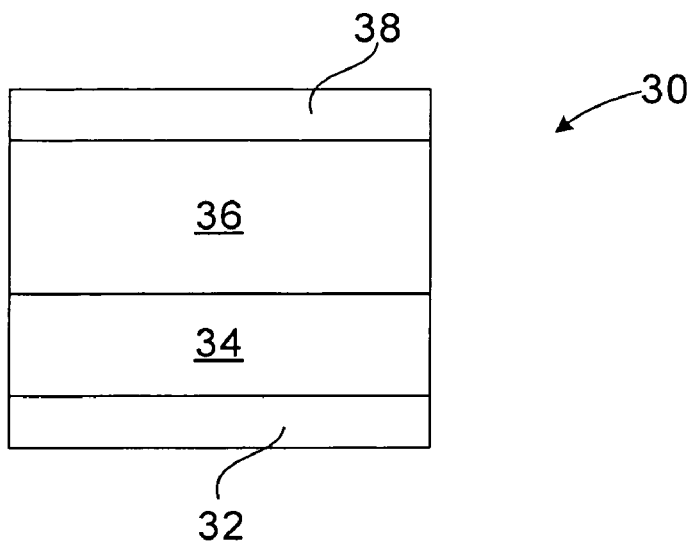
FIG. 1 is a cross-sectional view of an above-described memory device.
Figure 2:
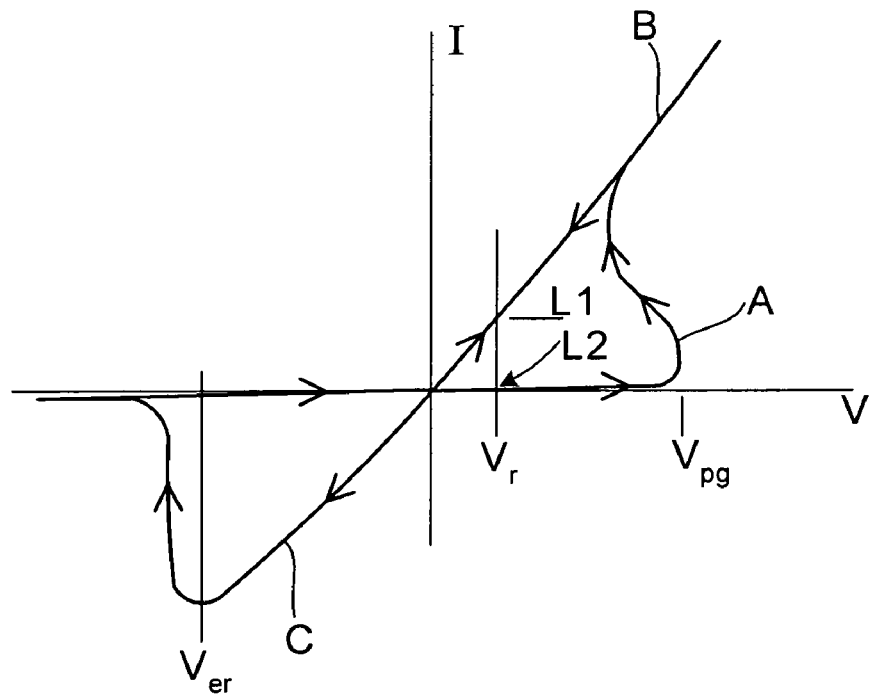
FIG. 2 is a plot of current vs. voltage illustrating operating characteristics of the memory device of FIG. 1.
Figure 3:
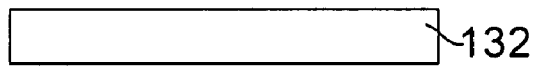
FIGS. 3-6 illustrate method steps in fabricating embodiments of the present invention.

FIGS. 3-6 illustrate a process for fabricating embodiments of memory element 130 in accordance with the present invention. Initially, an electrode 132 is provided (FIG. 3). The electrode 132 may be formed by any suitable technique, such as physical vapor deposition, i.e. PVD (such as thermal vacuum evaporation, e-beam deposition or sputtering), ion plating, chemical vapor deposition, i.e. CVD (such as metalorganic CVD, i.e. MOCVD), plasma-enhanced CVD, i.e. PECVD, and the like. The electrode 132 in this embodiment is copper, but it will be understood that the electrode 132 can be formed of any of a number of materials including aluminum, barium, calcium, chromium, cobalt, copper, germanium, gold, magnesium, manganese, molybdenum, indium, iron, nickel, palladium, platinum, ruthenium, samarium, silver, tantalum, titanium, tungsten, zinc, metal oxides, polysilicon, doped amorphous silicon, metal silicide, metal carbide, metal nitrides, magnesium-silver alloy, nickel-cobalt alloy, iron-nickel-cobalt alloy, iron-nickel alloy, nickel-copper alloy, and nickel-chromium alloy.

Figure 4:
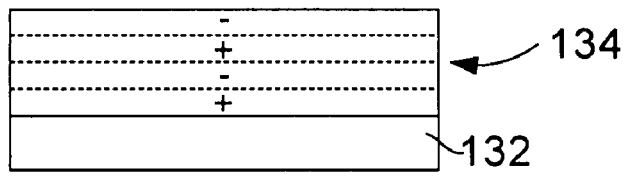

Then, and with reference to the above-cited patent, a passive layer 134 is formed over, on and in contact with the electrode 132 (FIG. 4). This layer 134 is made up of a plurality of self-assembled sublayers, with the self-assembly thereof being undertaken through suitable solution dipping, rinsing, drying, and repeating these steps to build up a passive layer 134 made up of these self-assembled sublayers. The self-assembly process is undertaken by appropriately preparing the surface of the electrode 132 for providing good adhesion of the first monolayer. Then, successive sublayers are assembled, each on top of the previous layer, the successive sublayers having opposite sign charge. Each successive pair of sublayers makes up a bilayer which includes a positively charged sublayer and a negatively charged sublayer. The bilayers are in a stacked configuration making up the passive layer 134, and the thickness of the passive layer 134 is proportional to the number of bilayers thereof. Materials possessing positive or negative charges on their molecular framework can be considered suitable candidates for these sublayers. These materials include conjugated inorganic polymers possessing positive or negative charge, conjugated organic polymers possessing positive or negative charge, non-conjugated polymers possessing positive or negative charge, inorganic complexes with multi-positive or multi-negative charge, and organic complexes with multi-positive or multi-negative charge.

Figure 5:
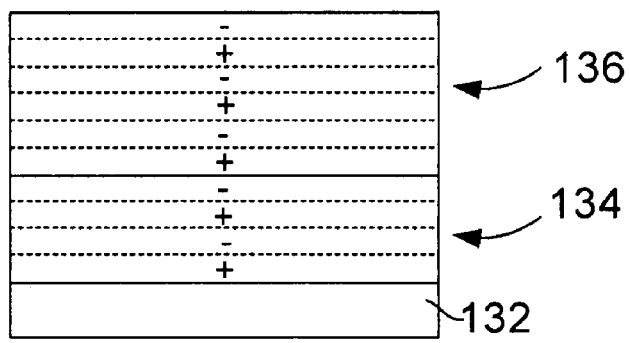

Then, an active layer 136 is formed over, on and in contact with the passive layer 134 (FIG. 5). This layer 136, similar to passive layer 134, is also made up of a plurality of self-assembled sublayers, with the self-assembly thereof being undertaken through suitable solution dipping, rinsing, drying, and repeating these steps to build up active layer 136 made up of these self-assembled sublayers. Successive sublayers are assembled, each on top of the previous layer, the successive sublayers having opposite sign charge. Each successive pair of sublayers makes up a bilayer which includes a positively charged sublayer and a negatively charged sublayer. The bilayers are in a stacked configuration making up the active layer 136, and the thickness of the active layer 136 is proportional to the number of bilayers thereof. Materials for these sublayers are as indicated above.

Figure 6:
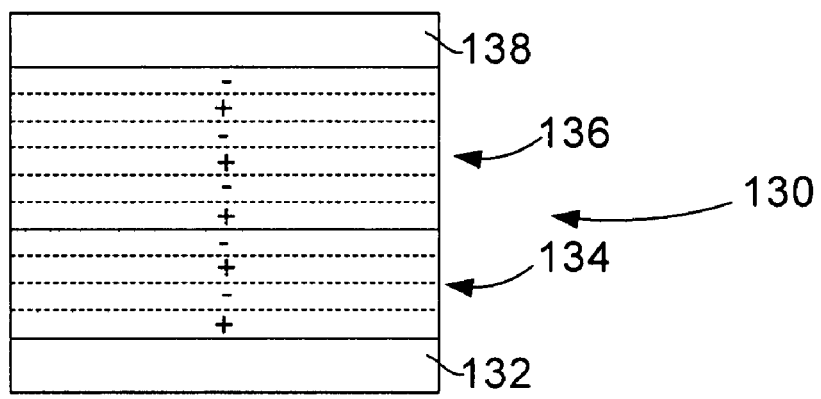

Then, an electrode 138 is formed to a desired thickness on, over and in contact with the active layer 136 (FIG. 6). The electrode 138 in this embodiment is titanium, but it will be understood that the electrode 138 may be formed of any the materials listed with regard to electrode 132, and may be formed by the techniques listed with regard to electrode 132.

FIG. 6 illustrates the fabricated memory element 130, wherein the layers 134, 136 are formed between the electrodes 132, 138.

The memory element 130 is programmed, erased, and read in a manner similar to that previously described. By selecting appropriate materials for the sublayers of the active and passive layers 136, 134, and the particular charges thereof, the operating characteristics of the memory device 130 can be tailored to the needs of the user. Indeed, it will be understood that either the active or passive layers 136, 134 can be formed of self-assembled sublayers, while the other of the active and passive layers 136, 134 can be of conventional form. For example, the active layer 136 be provided as set forth above, while the passive layer 134 can be a superionic layer. Furthermore, a single layer of self-assembled sublayers can be provided between and in contact with the electrodes 132, 138 to provide memory device characteristics.

Through this approach, the memory device is capable of retaining its programmed and erased states for a long period of time has chosen, and is also capable of generating rapid switching from one state to another.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A memory device comprising:
   first and second electrodes;
   an active layer;
   a passive layer;
   the active and passive layers being between the first and second electrodes;
   at least one of the active and passive layers comprising a plurality of sublayers, wherein at least one of the plurality of sublayers is a self-assembled sublayer of the passive layer, wherein at least one sublayer of the plurality thereof is a positively charged sublayer and at least another sublayer of the plurality thereof is a negatively charged sublayer.

2. The memory device of claim 1 wherein the self-assembled sublayer is a charged sublayer.

3. The memory device of claim 1 wherein each sublayer of the plurality thereof is a self-assembled sublayer.

4. The memory device of claim 3 wherein the sublayers of the plurality thereof are alternately positively and negatively charged.

5. A memory device comprising:
   first and second electrodes;
   an active layer;
   a passive layer;
   the active and passive layers being between the first and second electrodes;
   wherein the passive layer comprises a plurality of sublayers, wherein at least one sub layer of the plurality thereof is a self-assembled sublayer.

6. The memory device of claim 5 wherein each sublayer of the plurality thereof is a self-assembled sublayer.

7. The memory device of claim 6 wherein at Least one sublayer of the plurality thereof is a positively charged sublayer and at least another sublayer of the plurality thereof is a negatively charged sublayer.

8. The memory device of claim 7 wherein the sublayers of the plurality thereof are alternately positively and negatively charged.

9. A memory device comprising:
   first and second electrodes; and
   a layer between the first and second electrodes, the layer comprising a plurality of sublayers, wherein at least one of the plurality of sublayers is a self-assembled sublayer of a passive layer, wherein the sub layers of the plurality thereof are alternately positively and negatively charged.

10. The memory device of claim 9 wherein each sublayer of the plurality thereof is a self-assembled sublayer.

* * * * *